US008366982B2

(12) United States Patent
Simion

(10) Patent No.: US 8,366,982 B2
(45) Date of Patent: Feb. 5, 2013

(54) DIFFERENTIAL PRESSURE UNDERFILL PROCESS AND EQUIPMENT

(75) Inventor: Bogdan M. Simion, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 395 days.

(21) Appl. No.: 12/755,665

(22) Filed: Apr. 7, 2010

(65) Prior Publication Data

US 2011/0247852 A1    Oct. 13, 2011

(51) Int. Cl.
   *B29C 70/72* (2006.01)
   *B29C 45/14* (2006.01)
   *H01L 21/56* (2006.01)

(52) U.S. Cl. .......... 264/272.17; 249/105; 249/107; 425/117; 425/125; 425/129.1; 438/112

(58) Field of Classification Search .......... 425/110, 425/117, 125, 129.1; 249/105, 107; 438/112, 438/127; 264/272.17
   See application file for complete search history.

(56) References Cited

U.S. PATENT DOCUMENTS

| | | | | |
|---|---|---|---|---|
| 3,529,320 A | * | 9/1970 | Kerns et al. | 425/117 |
| 5,866,442 A | * | 2/1999 | Brand | 438/108 |
| 5,932,254 A | * | 8/1999 | Mitchell et al. | 425/117 |
| 6,000,924 A | * | 12/1999 | Wang et al. | 425/125 |
| 6,444,035 B1 | * | 9/2002 | Nowak et al. | 118/684 |
| 6,499,644 B2 | * | 12/2002 | Cox et al. | 228/19 |
| 7,594,805 B2 | * | 9/2009 | Miyakawa et al. | 425/110 |

* cited by examiner

*Primary Examiner* — Robert B Davis
(74) *Attorney, Agent, or Firm* — Winkle, PLLC

(57) ABSTRACT

The present disclosure relate to the field of depositing an underfill material between a microelectronic die and a substrate for flip-chip packages. In at least one embodiment, differential pressure is used to meter the underfill material during the underfill deposition process.

19 Claims, 8 Drawing Sheets

DIFFERENTIAL PRESSURE UNDERFILL PROCESS AND EQUIPMENT

BACKGROUND

A typical microelectronic package includes at least one microelectronic die that is mounted on a substrate such that bond pads on the microelectronic die are attached directly to corresponding bond lands on the substrate using reflowable solder balls. To enhance the reliability of the solder bumps connecting the microelectronic die pads and the substrate lands, an underfill material may be used to mechanically reinforce them.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
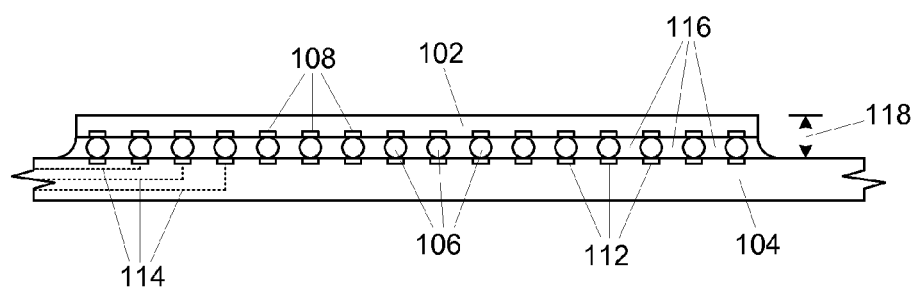
FIG. 1 illustrates a side cross-sectional view of a microelectronic die attached to a substrate with a plurality of interconnects.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of depositing an underfill material between a microelectronic die and a substrate for flip-chip packages. In at least one embodiment, differential pressure is used to meter the underfill material during the underfill deposition process.

In the production of microelectronic devices, microelectronic dice are generally mounted on substrates, which provide electrical communication routes between the microelectronic die and external components. As shown in FIG. 1, a microelectronic die 102, such as a microprocessor, a chipset, a graphics device, a wireless device, a memory device, an application specific integrated circuit, or the like, may be attached to a substrate 104, such as an interposer, a motherboard, and the like, through a plurality of interconnects 106, such as reflowable solder bumps or balls, in a configuration generally known as a flip-chip or controlled collapse chip connection ("C4") configuration. The interconnects 106 may extend between bond pads 108 on the microelectronic die 102 and mirror-image bond pads 112 on the substrate 104. The microelectronic die bond pads 108 are in electrical communication with integrated circuitry (not shown) within the microelectronic die 102. The substrate bond pads 112 are in electrical communication with conductive traces (shown as dashed lines 114) within the substrate 104. The conductive traces 114 provide electrical communication routes to external components (not shown).

The substrate 104 may be primarily composed of any appropriate material, including, but not limited to, bismaleimine triazine resin, fire retardant grade 4 material, polyimide materials, glass reinforced epoxy matrix material, and the like, as well as laminates or multiple layers thereof. The conductive traces 114 may be composed of any conductive material, including but not limited to metals, such as copper and aluminum, and alloys thereof.

The interconnects 106 can be made any appropriate material, including, but not limited to, solders and conductive filled epoxies. Solder materials may include may be any appropriate material, including but not limited to, lead/tin alloys, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic die 102 is attached to the substrate 104 with interconnects 106 made of solder, the solder is reflowed, either by heat, pressure, and/or sonic energy to secure the solder between the microelectronic die bond pads 108 and the substrate bond pads 112.

As also shown in FIG. 1, an electrically-insulating underfill material 116 may be disposed between the microelectronic die 102 and the substrate 104, and around the interconnects 106. The underfill material 116 may be used to overcome the mechanical stress issues that can arise from thermal expansion mismatch between the microelectronic die 102 and the substrate 104. The underfill material 116 may be an epoxy material that has sufficiently low viscosity to be wicked between the microelectronic die 102 and the substrate 104 by capillary action when introduced by a dispenser along an edge of the microelectronic die 102, which will be understood to those skilled in the art. The underfill material 116 may then be subsequently cured (hardened).

The microelectronics industry continuously strives to reduce the size of microelectronic dice and packages. As the distance between microelectronic dice (die-to-die distance) has become smaller, the placement accuracy of and size of standard underfill dispensers can make it prohibitive to use standard underfill dispense technology in die-to-die distances of less than about 1 millimeter. Further restrictions come from the maximum amount of the underfill material that can be dispensed in confined space in a single pass (restrictions on volume become even more stringent with the reduction of die height).

Figure 2:
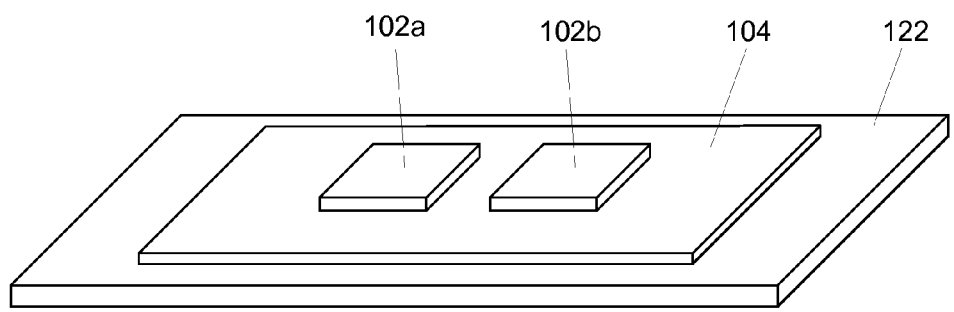
FIG. 2 illustrates an oblique view of a pair of microelectronic dice attached in a flip-chip arrangement on a substrate, which is positioned on a carrier.

As shown in FIG. 2, a pair of microelectronic dice, a first microelectronic die 102a and a second microelectronic die 102b may be aligned and attached to the substrate 104 prior to the dispensation of the underfill material 116. The substrate 104 may be placed on a substantially rigid carrier 122, which may be used to transport the assembly through various processing steps. Although the present disclosure will be described in terms of a pair of microelectronic dice, it is merely for convenient exemplary purposes, and it is understood that the substrate may have any number of microelectronic dice attached thereto.

Figure 3:
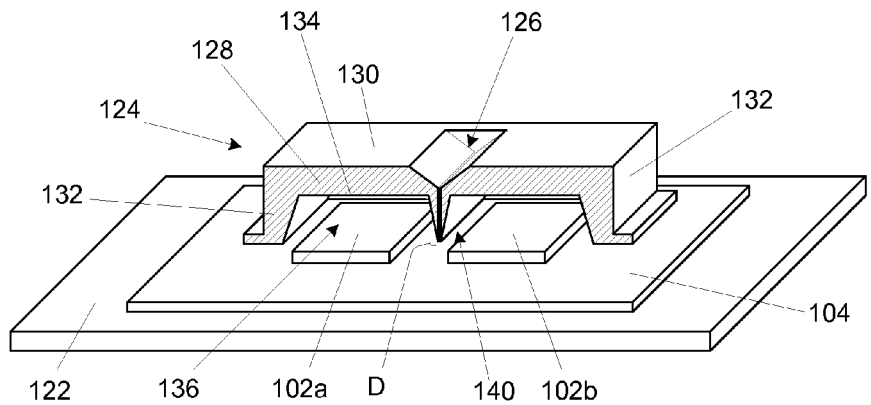
FIG. 3 illustrates an oblique, partial cross-sectional view of the assembly of FIG. 2 with a vacuum enclosure disposed over the microelectronic dice.

As shown in FIG. 3, a vacuum enclosure 124 may be placed over the first microelectronic die 102a and the second microelectronic die 102b. The vacuum enclosure 124 may include a reservoir 126 to contain a predetermined volume of underfill material required for substantially complete underfill of the pair of microelectronic dice, the first microelectronic die 102a and the second microelectronic die 102b.

In one embodiment, the reservoir 126 may be formed in a first wall 128 of the vacuum enclosure 124 extending into the vacuum enclosure 124 from an external surface 130 of the vacuum enclosure first wall 128. The vacuum enclosure 124 may further include at least one sidewall 132 extending substantially perpendicular from an interior surface 134 from the vacuum enclosure first wall 128 to define a chamber 136 and an opening 138 (see FIG. 5) opposing the vacuum enclosure first wall 128. The vacuum enclosure 124 may yet further include an underfill dispensation device 140, such as a fin, extending from the vacuum enclosure first wall interior surface 134 of the vacuum enclosure first wall 128 to a position between the first microelectronic die 102a and the second microelectronic die 102b. Referring to FIG. 5, the underfill dispensation device 140 may include a conduit 142 extending the length of the underfill dispensation device 140 and providing a passage through the underfill dispensation device 140 from the reservoir 126 to a tip 144 of the underfill dispensation device 140. It is, of course, understood that although the underfill dispensation device conduit 142 is illustrated as a slot, it could also be a plurality of tubes or other such conduits. As also show in FIG. 5, the underfill dispensation device 140 substantially bifurcates the defined vacuum enclosure chamber 138 into a first chamber 138a, which substantially surrounds the first microelectronic die 102a (see FIG. 4), and a second chamber 138b, which substantially surrounds the second microelectronic die 102b (see FIG. 4). The vacuum enclosure 124 may also include a sealing surface, such as a flange 146 adjacent the vacuum enclosure sidewalls 132 proximate the vacuum enclosure opening 138 substantially opposing the vacuum enclosure first wall 128, that abuts the substrate 104 to seal the vacuum enclosure 124 to the substrate 104 (see FIG. 4). The vacuum enclosure flange 146 may include a seal or other resilient device (not shown) to assist in the sealing of vacuum enclosure 124 to the substrate 104 (see FIG. 4).

In one embodiment, the underfill dispensation device 140 is sufficiently narrow to be inserted between and proximate the first microelectronic die 102a and the second microelectronic die 102b, and the underfill dispensation device 140 may be designed such that a distance D between the dispensation device tip 144 and the substrate 104 smaller than the microelectronic die height 118 (see FIG. 1). In another embodiment, the underfill dispensation device conduit 142 may be sized such that a surface tension of the underfill material 116 used would not allow free fall at the temperature at which the underfill material 116 would be dispensed into the reservoir 126. Thus, no flow of the underfill material 116 would occur at atmospheric pressure. It is, of course, understood that an appropriate dimension of the underfill dispensation device conduit 142 may be calculated based on the physical properties of the underfill material 116 that is selected.

In one embodiment of the present disclosure, the vacuum enclosure 124 can be made of a low surface energy material or the reservoir 126 and underfill dispensation device conduit 142 can be coated with a low surface energy material, such as Teflon°, to reduce adhesion of underfill material 116 to the reservoir 126 and the underfill dispensation device conduit 142 and assist the underfill material 116 to flow with minimum surface resistance.

Figure 4:
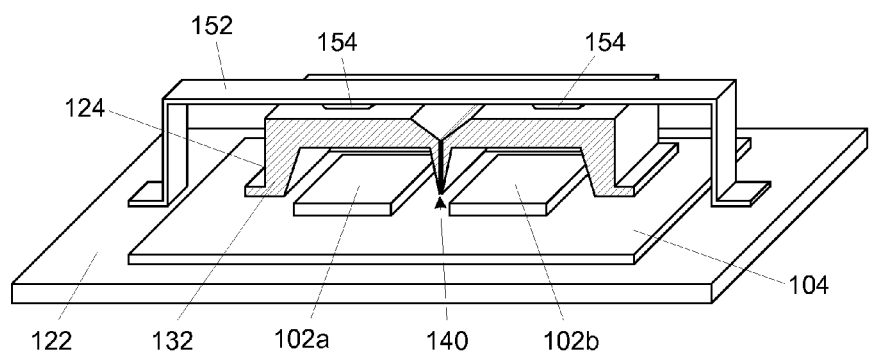
FIG. 4 illustrates an oblique, partial cross-sectional view of the assembly of FIG. 3 with a restrainer bracket securing the vacuum enclosure to the substrate.
Figure 5:
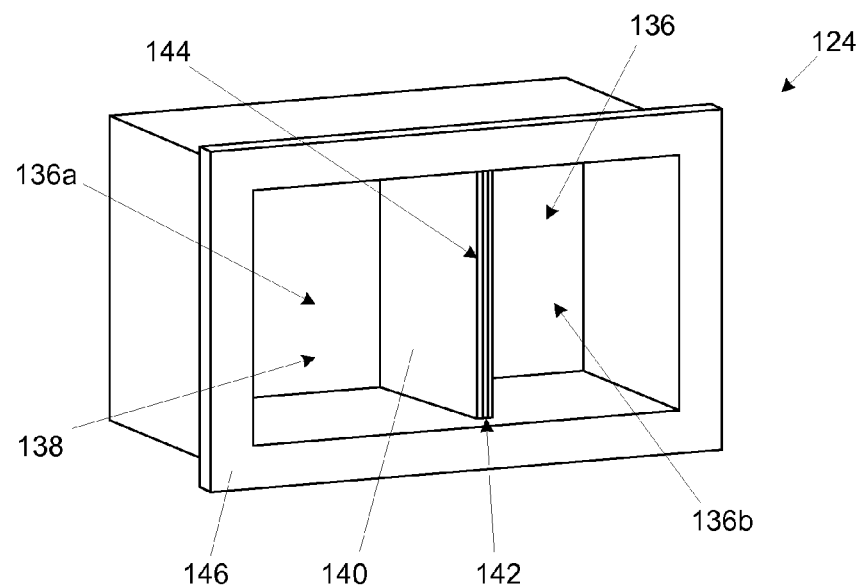
FIG. 5 illustrates an oblique view of the vacuum enclosure.

As shown in FIG. 4, a retention device 152 may be attached to the carrier 122 and apply a force on the vacuum enclosure first wall external surface 130, such as through leveraging devices 154 (e.g., springs and the like). This applied force can seal the vacuum enclosure flange 146 against the substrate 104 such that the vacuum enclosure first chamber 136a and the vacuum enclosure second chamber 136b are separated from atmosphere when an underflow material is placed in the reservoir 126.

Figure 6:
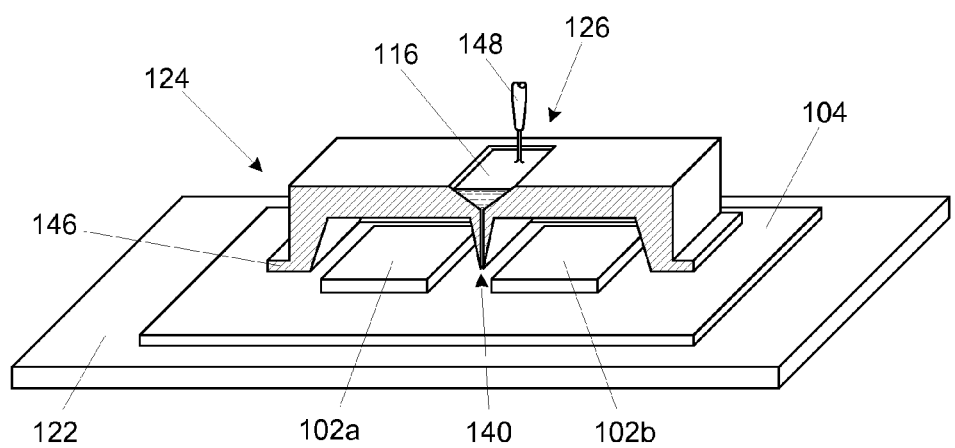
FIG. 6 illustrates an oblique, partial cross-sectional view of the assembly of FIG. 3 having an underfill material dispensed into an underfill material reservoir within the vacuum enclosure.

As shown in FIG. 6, an underfill material 116 may be dispensed into the reservoir 126 (see FIG. 3), such as by a dispense needle 148, to a predetermined volume required for substantially complete underfill the pair of microelectronic dice, the first microelectronic die 102a and the second microelectronic die 102b. The reservoir 126 and dispensation device 140 may be designed in light of the viscosity of the underfill material 116, such that the underfill material 116 does not exit the dispensation device 140 until a differential pressure is applied, as will be discussed.

Figure 7:
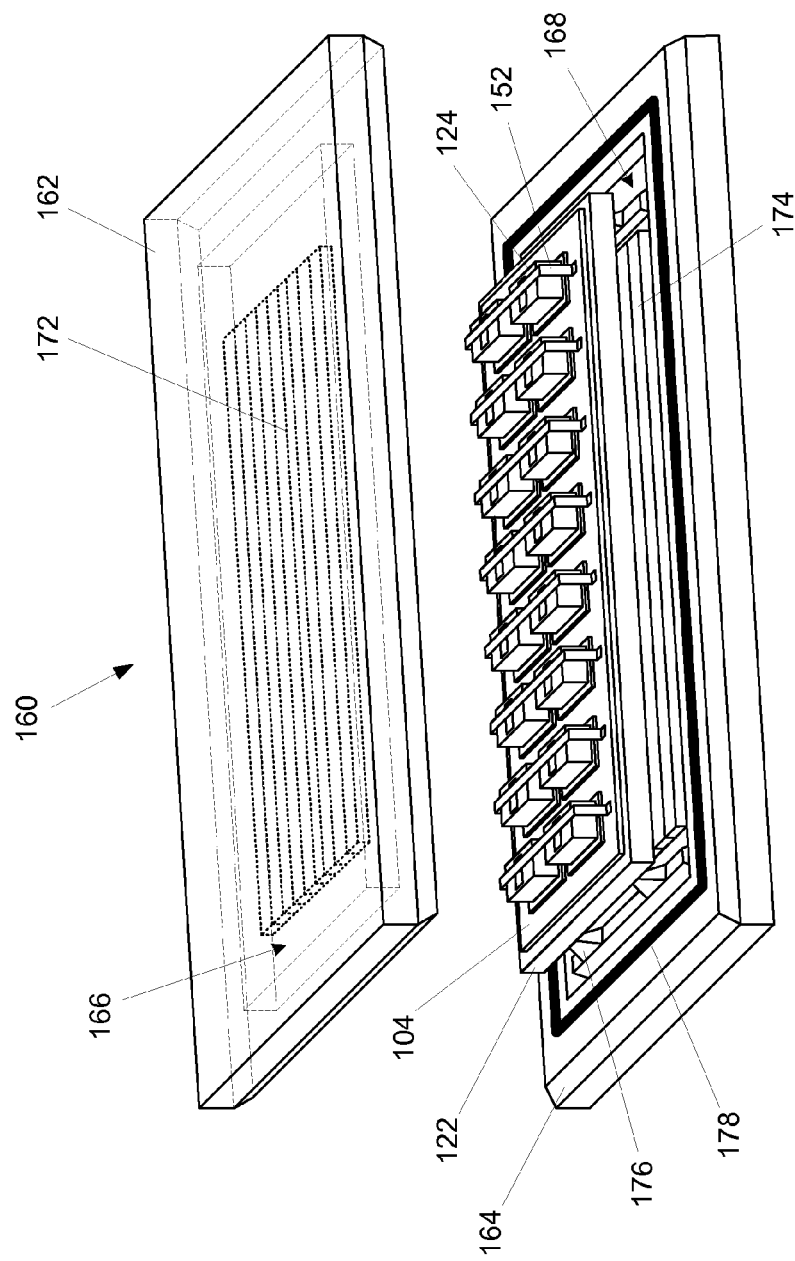
FIG. 7 illustrates an oblique view of a vacuum process chamber.

After the underfill material 116 has been dispensed into the reservoir 126 (see FIG. 3), the carrier 122 is placed in a vacuum chamber. FIG. 7 illustrates an oblique exploded view of a vacuum chamber 160. The illustrated vacuum chamber 160 comprises an upper chamber 162 and a lower chamber 164, each including a recess 166 and 168 therein (the upper chamber recess 166 shown in shadow). The upper chamber 162 and the lower chamber 164 are adapted to seal against one another. The upper chamber recess 166 and the lower chamber recess 168 may each include heating devices 172 and 174, respectively, such as infrared heaters (the upper chamber heating device 172 shown in shadow). The carrier 122 may be placed in the vacuum chamber 160 resting on carrier guides 176, which may position the carrier 122 at an appropriate distance from the upper chamber heating device 172 and the lower chamber heating device 174. A chamber seal 178 may be provided to make an airtight seal between the upper chamber 162 and the lower chamber 164. It is understood that the volume of the upper chamber recess 166 and the lower chamber recess 168 should be a small as possible to keep the pump down and depressurization time to a minimum.

In operation, the upper chamber heating device 172 may be primarily used to increase the temperature of the underfill material 116 in the reservoir 126, thereby reducing the viscosity of the underfill material 116. The lower chamber heating device 174 may be primarily used to heat the substrate 104 to maintain the reduced viscosity of the underfill material 116, thereby promoting flow of the dispensed underfill material 116 as it is wicked between the microelectronic die 102 and the substrate 104 (see FIG. 1).

Figure 8:
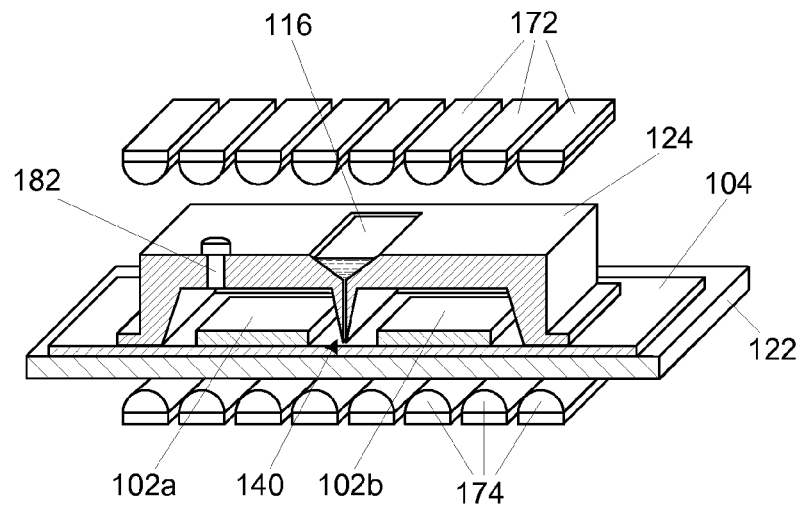
FIG. 8 illustrates an oblique, partial cross-sectional view of the assembly of FIG. 7 within the vacuum process chamber during an air evacuation process.

FIG. 8 shows a simplified partial cross-section of the assembly of FIG. 6 within the vacuum chamber 160 with the upper chamber 162 (not shown) and the lower chamber 164 (not shown) and illustrates a step of the air evacuation from the vacuum chamber 160 and vacuum enclosure 124. While the air is removed from the vacuum chamber 160, air is also removed from the vacuum enclosure 124 through a release valve 182 extending through the vacuum enclosure first wall 128. It is understood that the release valve 182 may also extend through the sidewall 132. In one embodiment, the pressure with the vacuum chamber 160 and the vacuum enclosure 124 may be brought from atmospheric pressure of between about 100 and 130 kPa down to a vacuum of about 0 kPa. In another embodiment, the release valve 182 is made of a highly lubricous material, such that as the pressure in the vacuum chamber 160 drops, the air trapped in the vacuum enclosure 124 escapes through the release valve 182 and not by bubbling through the underfill material 116 in the reservoir 126. To assist in this, the upper chamber heating device 172 and the lower chamber heating device 174 are not in operation, thus allowing the underfill material 116 to stay substantially at its dispensation temperature (i.e, at higher viscosity than when heated).

Figure 9:
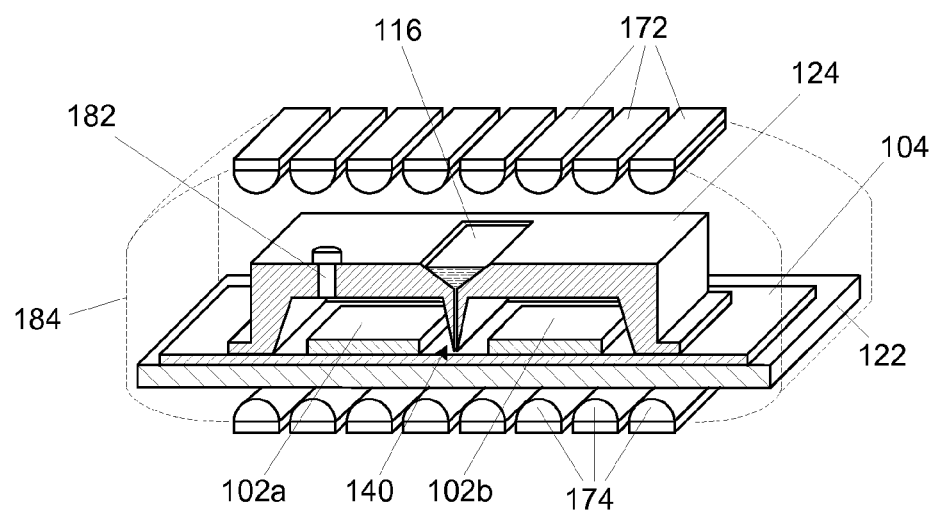
FIG. 9 illustrates the assembly of FIG. 8 during a heating process.

As shown in FIG. 9, once the air has been substantially evacuated, the upper chamber heating device 172 and the lower chamber heating device 174 may be activated. The underfill material 116 and the substrate 104 may then be heated to their appropriate processing temperatures. A heat field 184 generated by the upper chamber heating device 172 and the lower chamber heating device 174 is shown as a dashed line. It is, of course, understood that the upper chamber heating device 172 and the lower chamber heating device 174 can be individually regulated to optimize the particular desired temperatures of the underfill material 116 and the substrate 104, which may be different. In one embodiment, pressure within the vacuum chamber 160 and within the vacuum enclosure 124 remains substantially equal while the underfill material 116 and the substrate 104 are heated to their appropriate processing temperatures.

Figure 10:
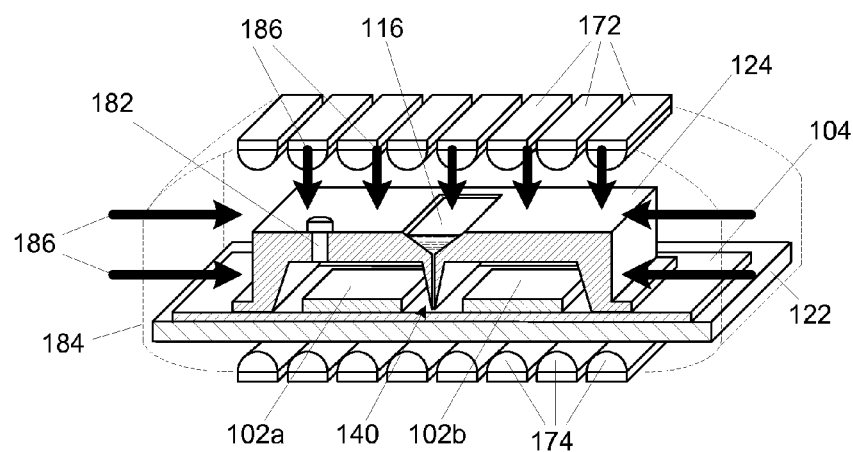
FIG. 10 illustrates the assembly of FIG. 9 during a pressure differential process.

As shown in FIG. 10, the heat being applied to the underfill material 116 and the substrate 104 may be maintained while air is allowed to enter the vacuum chamber 160 in a controlled fashion. The pressure differential, shown as arrows 186, between the vacuum enclosure 124 and the vacuum chamber 160 pushes the heated underfill material 116 from the reservoir 126, through the underfill dispensation device conduit 142, and between the first microelectronic die 102a and the second microelectronic die 102b. The pressure of the vacuum chamber 160 may be regulated in a controlled manner such that the dispense rate of the underfill material 116 from the reservoir 126 matches the flow of the underfill material 116 as it wicks between the first microelectronic die 102a and the substrate 104 and between the second microelectronic die 102b and the substrate 104.

Figure 11:
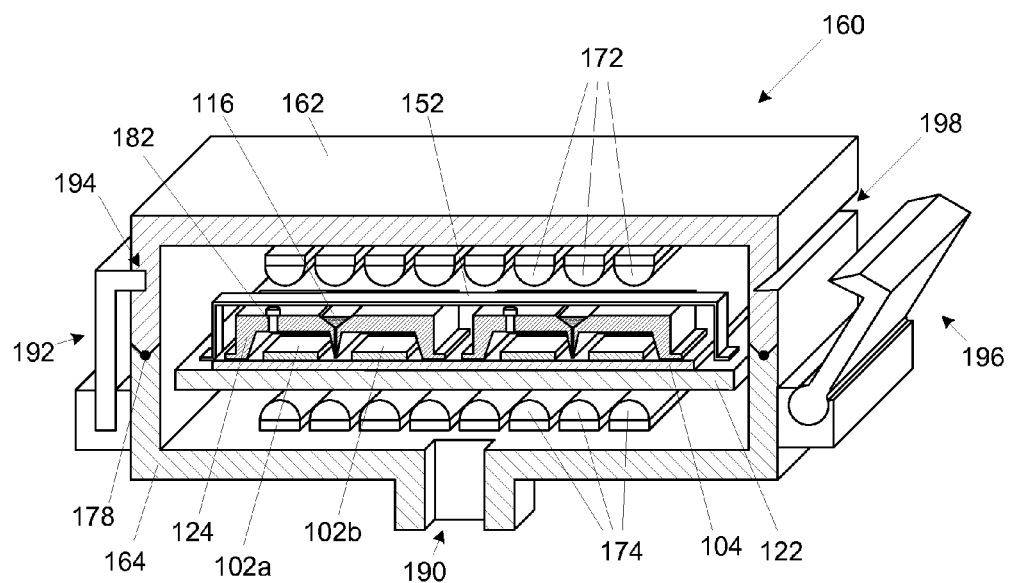
FIG. 11 illustrates the assembly of FIG. 10 having a locking mechanism.

As shown in FIG. 11, the vacuum chamber 160 may include a locking mechanism to assist in ensuring pressure integrity. The locking mechanism may including any appropriate device known in the art, including but not limited to, clips, clamps, clasps, and the like. The locking mechanism illustrated in FIG. 11 includes a stationary clasp 192 attached to the lower chamber 164 and a portion thereof inserted into a first channel 194 in the upper chamber 162, and includes a rotating clasp 196 rotationally attached to the lower chamber 164 opposing the stationary clasp 192, wherein the rotating clasp 198 is adapted to insert into a second channel 198 in the upper chamber. Furthermore, the pressure control in the vacuum chamber 160 may be effectuated by an opening 190 or an array of such openings in the lower chamber 164.

Figure 12:
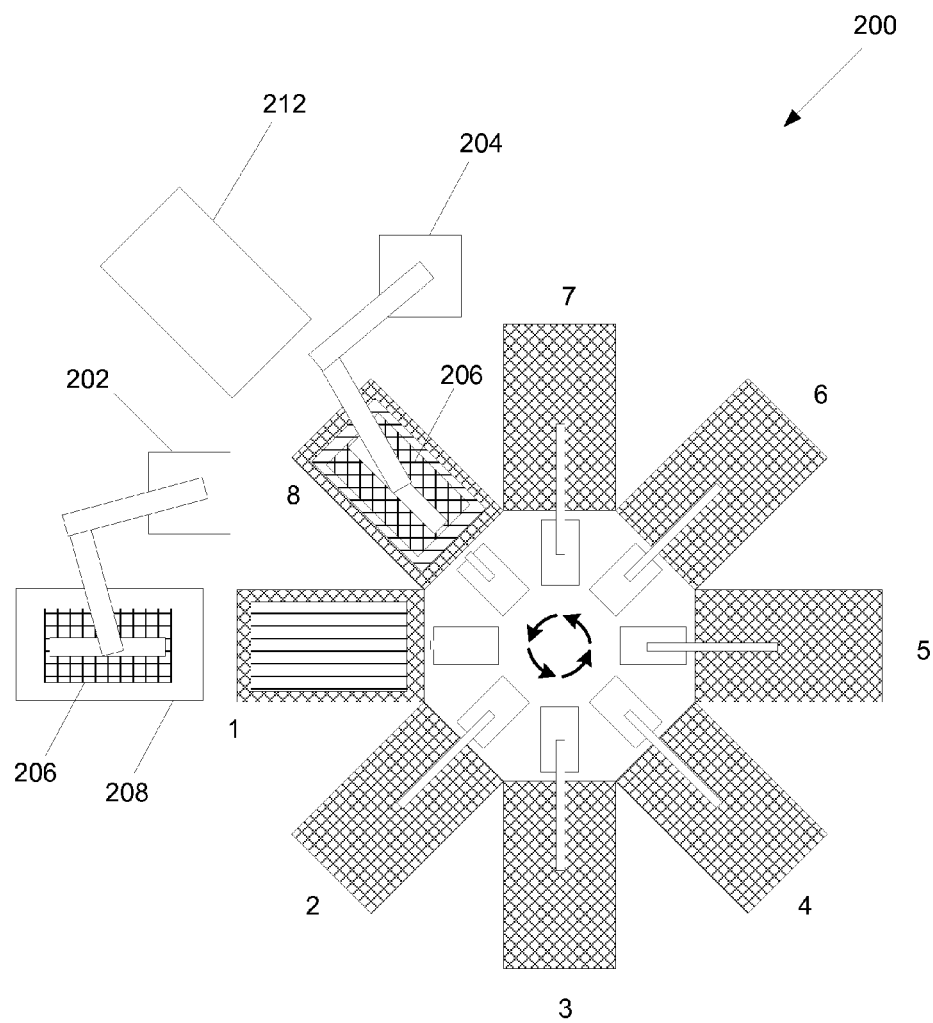
FIG. 12 illustrates a top plan view of an automated processing carousel.

It may be necessary for a certain amount of time to elapse to achieve complete underfill of a microelectronic die. Thus, a carousel system 200 may be used to prevent delay in a fabrication process, as shown in FIG. 12. In the illustrated embodiment, the carousel system 200 houses eight (8) vacuum chambers that can be continuously loaded, processed, and un-loaded, during a complete rotation thereof. Two automatic robotic arms are responsible for loading (first robotic arm 202) and un-loading (second robotic arm 204) of the carousel system 200. In one embodiment, a carrier 206 loaded with microelectronic dice and vacuum enclosures residing on a loading table 208 is picked up by the first robotic arm 202 and may be placed in the vacuum chamber at position 1 (the upper chamber is not shown, as it in is an open position). The vacuum chamber is closed and rotated counter-clockwise to position 2 where air may be evacuated from the vacuum chamber and vacuum enclosure(s) with the heating devices off, as described for FIG. 8. The vacuum chamber may then be rotated counter-clockwise to position 3 where the heating devices may be turned on, as described for FIG. 9. The vacuum chamber may then be rotated counter-clockwise to positions 4 through 7 while the pressure differential underfill process occurs, as described for FIG. 10. The vacuum chamber may then be rotated counter-clockwise to position 8 where the upper chamber is lifted (and not shown). The second robotic 204 may retrieve the loaded carrier 206 from the vacuum chamber and may place the loaded carrier 206 on an off-load table 212.

Figure 13:
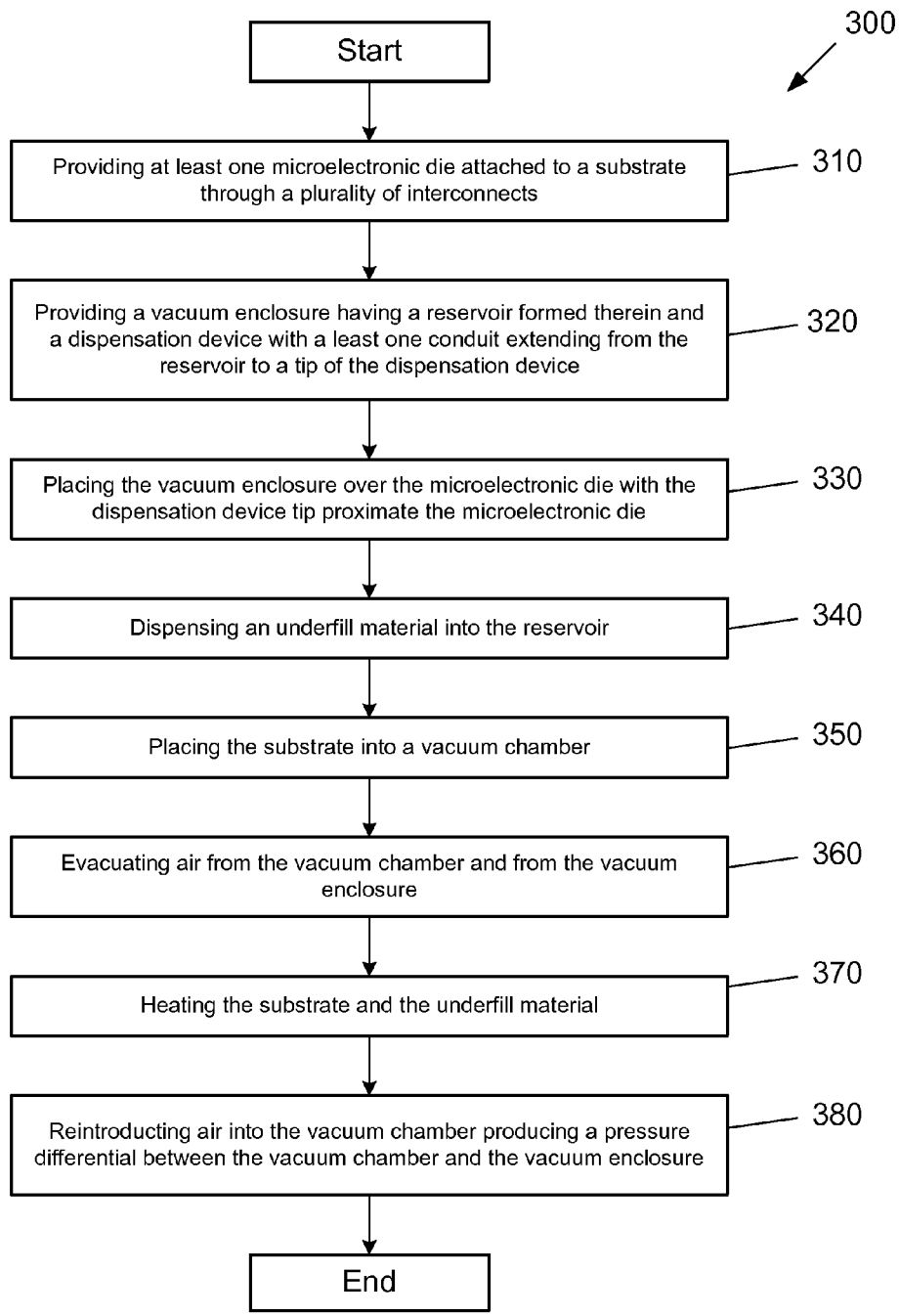
FIG. 13 is a flow diagram of a process of the present disclosure.

FIG. 13 illustrates a process flow 300 of the present description. As represented in block 310, at least one microelectronic die attached to a substrate through a plurality of interconnects is provided. A vacuum enclosure, having a reservoir formed therein and a dispensation device with at least one conduit extending from the reservoir to a tip of the dispensation device, may be provide, as represented in block 320. The vacuum enclosure may be placed over the microelectronic die such that the dispensation tip is proximate the microelectronic die, as represented in block 330. An underfill material may be dispensed into the reservoir, as represented in block 340. The substrate may then be placed in a vacuum chamber, as represented in block 350. It is understood that the substrate may be placed on a carrier prior to dispensing the underfill material and placing the substrate into the vacuum chamber. Air may be evacuated from the vacuum chamber and evacuated from the vacuum enclosure through a valve in the vacuum enclosure, as represented in block 360. The substrate and the underfill material may then be heated to reduce the viscosity of the underfill material, as represented in block 370. Air is then reintroduced into the vacuum chamber such that a pressure differential between the vacuum chamber and the vacuum enclosure which transports the underfill material from the reservoir, through the conduit, and to the microelectronic die, as represented in block 380.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments. The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A vacuum enclosure, comprising:
   a first wall having an outer surface and an inner surface;
   at least one sidewall side extending from the first wall inner surface defining a chamber and an opening opposing the first wall;
   a flange adjacent the at least one sidewall side and proximate the opening;
   a reservoir in the first wall extending from the first wall outer surface;
   a dispensation device extending from the first wall inner surface into the chamber; and
   at least one conduit extending from the reservoir to a dispensation tip of the dispensation device.

2. The vacuum enclosure of claim 1, wherein the dispensation device substantially divides the chamber into a first chamber and a second chamber.

3. The vacuum enclosure of claim 2, wherein the first chamber is adapted to surround a first microelectronic die and the second chamber is adapted to surround a second microelectronic die.

4. The vacuum enclosure of claim 3, wherein the dispensation tip is positioned between the first microelectronic die and the second microelectronic die.

5. The vacuum enclosure of claim 4, wherein the dispensation tip is positioned below a height of the first microelectronic die and the second microelectronic die.

6. An underfill assembly, comprising:
   a vacuum enclosure, including:
      a first wall having an outer surface and an inner surface;
      at least one sidewall side extending from the first wall inner surface defining a chamber and an opening opposing the first wall;
      a reservoir in the first wall extending from the first wall outer surface;
      a flange adjacent the at least one sidewall side and proximate the opening;
      a dispensation device extending from the first wall inner surface into the chamber; and
      at least one conduit extending from the reservoir to a dispensation tip of the dispensation device; and
   a vacuum chamber, including:
      an upper chamber; and
      a lower chamber, wherein the upper chamber and the lower chamber are adapted to seal against one another.

7. The underfill assembly of claim 6, wherein the upper chamber further includes a heating device.

8. The underfill assembly of claim 6, wherein the lower chamber further includes a heating device.

9. The underfill assembly of claim 7, wherein the lower chamber further includes at least one carrier guide adapted to receive a carrier supporting at least one of the vacuum enclosures.

10. The underfill assembly of claim 6, further including a chamber seal disposed between the upper chamber and the lower chamber.

11. The underfill assembly of claim 10, wherein the vacuum chamber further including a locking mechanism to secure the upper chamber to the lower chamber.

12. The underfill assembly of claim 6, wherein the lower chamber includes an opening for regulating pressure within the vacuum chamber.

13. The underfill assembly of claim 6, wherein the dispensation device substantially bifurcates the chamber into a first chamber and a second chamber.

14. The underfill assembly of claim 12, wherein the first chamber is adapted to surround a first microelectronic die and the second chamber is adapted to surround a second microelectronic die.

15. The underfill assembly of claim 13, wherein the dispensation tip is positioned between the first microelectronic die and the second microelectronic die.

16. The underfill assembly of claim 14, wherein the dispensation tip is positioned below a height of the first microelectronic die and the second microelectronic die.

17. A method of underfilling a microelectronic die, comprising:
    providing at least one microelectronic die attached to a substrate through a plurality of interconnects;
    providing a vacuum enclosure having a reservoir formed therein and a dispensation device with at least one conduit extending from the reservoir to a tip of the dispensation device;
    placing the vacuum enclosure over the microelectronic die with the tip of the dispensation device proximate the microelectronic die;
    dispensing an underfill material into the reservoir;
    placing the substrate into a vacuum chamber;
    evacuating air from the vacuum chamber and from the vacuum enclosure;
    heating the substrate and the underfill material;
    reintroducing air into the vacuum chamber producing a pressure differential between the vacuum chamber and the vacuum enclosure.

18. The method of claim 17, further comprising placing the substrate on a carrier prior to placing the substrate into the vacuum chamber.

19. The method of claim 17, wherein evacuating air from the vacuum enclosure comprises evacuating air from the vacuum enclosure through a valve in the vacuum enclosure.

* * * * *